(12) United States Patent
Kim et al.

(10) Patent No.: US 10,706,994 B2
(45) Date of Patent: Jul. 7, 2020

(54) VARISTOR

(71) Applicant: SAMSUNG ELECTRO-MECHANICS CO., LTD., Suwon-si, Gyeonggi-do (KR)

(72) Inventors: Ic Seob Kim, Suwon-si (KR); Jung Il Kim, Suwon-si (KR); Yong Sung Kim, Suwon-si (KR); Eun Ju Oh, Suwon-si (KR); Su Rim Bae, Suwon-si (KR); Hae In Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/535,434

(22) Filed: Aug. 8, 2019

(65) Prior Publication Data
US 2020/0105444 A1 Apr. 2, 2020

(30) Foreign Application Priority Data

Oct. 1, 2018 (KR) .................. 10-2018-0116805

(51) Int. Cl.
| | |
|---|---|
| *H01C 7/112* | (2006.01) |
| *H01C 7/10* | (2006.01) |
| *H01C 7/12* | (2006.01) |
| *H01G 4/005* | (2006.01) |
| *H01L 27/02* | (2006.01) |
| *H01G 2/06* | (2006.01) |
| *H01C 13/02* | (2006.01) |

(52) U.S. Cl.
CPC .......... *H01C 7/112* (2013.01); *H01C 7/1006* (2013.01); *H01C 7/12* (2013.01); *H01C 13/02* (2013.01); *H01G 2/06* (2013.01); *H01G 4/005* (2013.01); *H01L 27/0248* (2013.01)

(58) Field of Classification Search
CPC ...... H01C 7/112; H01C 7/1006; H01C 13/02; H01L 27/0248
See application file for complete search history.

(56) References Cited

U.S. PATENT DOCUMENTS

| | | | | |
|---|---|---|---|---|
| 4,660,017 A | * | 4/1987 | Momoki | H01C 7/102 338/21 |
| 4,706,060 A | * | 11/1987 | May | H01C 7/102 338/20 |
| 4,785,276 A | * | 11/1988 | May | H01C 7/102 338/21 |

(Continued)

FOREIGN PATENT DOCUMENTS

| | | |
|---|---|---|
| JP | 5444593 B2 | 3/2014 |
| JP | 2014-138172 A | 7/2014 |
| KR | 10-2014-0112884 A | 9/2014 |

*Primary Examiner* — Kyung S Lee
(74) *Attorney, Agent, or Firm* — Morgan, Lewis & Bockius LLP

(57) ABSTRACT

A varistor includes a varistor body, a first terminal disposed on one side of the varistor body, a second terminal disposed on the other side of the varistor body, a first electrode disposed on an upper portion of the varistor body, electrically connected to the first terminal, and extending towards the other side of the varistor body, and a second electrode disposed on a lower portion of the varistor body, electrically connected to the second terminal, and extending towards the one side of the varistor body.

17 Claims, 13 Drawing Sheets

(56) References Cited

U.S. PATENT DOCUMENTS

| | | | | |
|---|---|---|---|---|
| 4,959,505 A | * | 9/1990 | Ott | H01C 17/006 |
| | | | | 174/536 |
| 5,258,738 A | * | 11/1993 | Schat | H01C 1/144 |
| | | | | 338/20 |
| 5,339,068 A | * | 8/1994 | Tsunoda | H01C 1/02 |
| | | | | 338/308 |
| 5,455,555 A | * | 10/1995 | Onabuta | H01C 7/102 |
| | | | | 338/20 |
| 6,184,771 B1 | * | 2/2001 | Suzuki | H01C 7/112 |
| | | | | 338/20 |
| 8,081,059 B2 | * | 12/2011 | Tanimura | H01C 1/148 |
| | | | | 338/307 |
| 2013/0162388 A1 | * | 6/2013 | Gomi | H01C 7/10 |
| | | | | 338/21 |
| 2014/0262463 A1 | | 9/2014 | Lee et al. | |

* cited by examiner

VARISTOR

CROSS-REFERENCE TO RELATED APPLICATION(S)

This application claims benefit of priority to Korean Patent Application No. 10-2018-0116805 filed on Oct. 1, 2018 in the Korean Intellectual Property Office, the disclosure of which is incorporated herein by reference in its entirety.

TECHNICAL FIELD

The present disclosure relates to a varistor.

BACKGROUND

Generally, information communication devices such as advanced IT terminals, and the like, have been designed to have increased integration density, to use a semiconductor device/chip/module in which fine line width technology is applied, and to use a high efficiency passive component such as a multilayer ceramic capacitor (MLCC) to reduce a size and to use low power.

However, such a semiconductor device/chip/module may be vulnerable to withstand voltage, and the like, such that a semiconductor device/chip/module may be broken or may malfunction due to a surge or electrostatic discharge (ESD) caused in various routes.

A varistor may be used to absorb a surge or to filter electrostatic discharge.

Also, recently, automobiles have been developed as highly advanced electronic products based on ICT convergence, rather than mechanical products.

A semiconductor device/chip/module and a passive component included in an automobile may also be broken or malfunction due to a surge or electrostatic discharge.

For example, if an automotive smart car is malfunctioned for such reasons, safety of a driver and pedestrians may be compromised. Accordingly, it may be important to prevent a surge from flowing into a circuit and to control a surge.

Thus, an automobile may use a varistor for protecting a semiconductor device/chip/module.

As mentioned above, a varistor has been increasingly used in various fields, and a varistor may thus be required to have a variety of properties depending on an object to protect and a purpose of protection.

For example, a varistor used as a component for a vehicle may be designed to have relatively high breakdown voltage and capacitance as compared to a varistor used in an IT terminal, and a varistor used in an IT terminal may be designed to have relatively low capacitance to reduce high frequency signal loss. Further, when an object to be protected is small-sized, a varistor may be designed to have low breakdown voltage of several to several tens of a voltage level, and may also be designed to have a breakdown voltage of several hundreds to several thousands of a voltage level depending on an object to be protected.

SUMMARY

An aspect of the present disclosure is to provide a varistor of which at least one of various properties thereof (e.g., breakdown voltage, capacitance, an I-V curve slope, an ability to absorb ESD noise, a maximum current, and the like) may be adjusted.

According to an aspect of the present disclosure, a varistor is provided, the varistor including a varistor body; a first terminal disposed on one side of the varistor body; a second terminal disposed on the other side of the varistor body; a first electrode disposed on an upper portion of the varistor body, electrically connected to the first terminal, and extending towards the other side of the varistor body; and a second electrode disposed on a lower portion of the varistor body, electrically connected to the second terminal, and extending towards the one side of the varistor body.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1A:
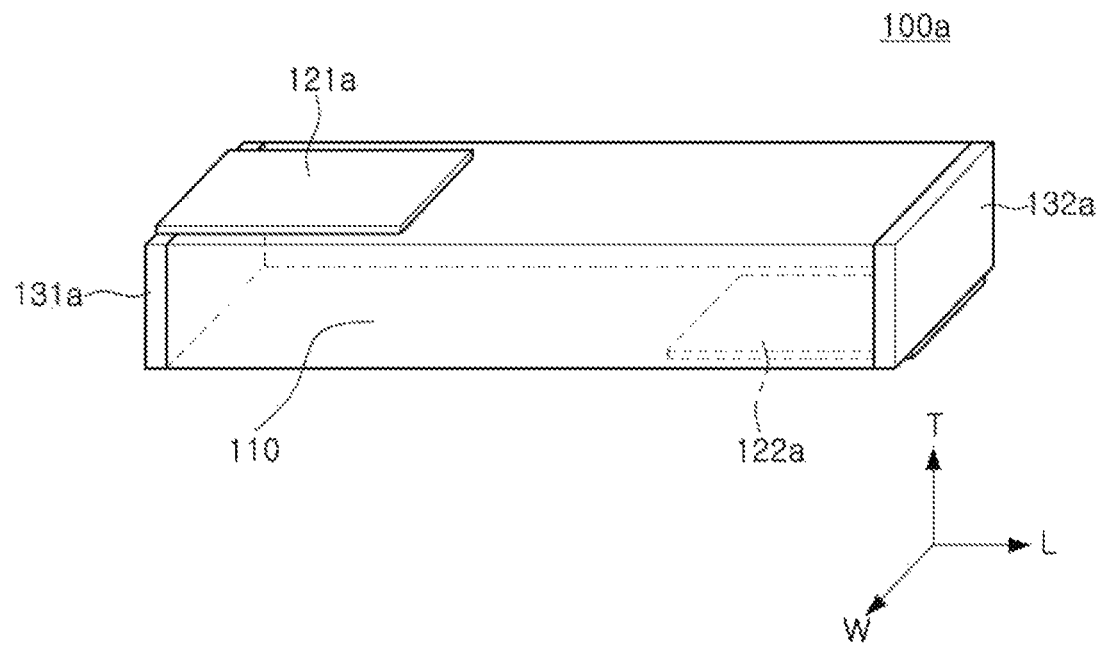
FIGS. 1A and 1B are perspective views illustrating a varistor according to an example embodiment of the present disclosure.

Hereinafter, embodiments of the present disclosure will be described as follows with reference to the attached drawings.

These embodiments are described in sufficient detail to enable those skilled in the art to practice the invention. It is to be understood that the various embodiments of the invention, although different, are not necessarily mutually exclusive. For example, structures, shapes, and sizes described as examples in embodiments in the present disclosure may be implemented in another example embodiment without departing from the spirit and scope of the present disclosure. Shapes and sizes of elements in the drawings may be exaggerated for clarity of description, and the same elements will be indicated by the same reference numerals.

For clarity of description, some elements may be omitted or briefly illustrated, and thicknesses of elements may be magnified to clearly represent layers and regions.

It will be understood that when a portion "includes" an element, it can further include another element, not excluding another element, unless otherwise indicated.

With respect to directions of a hexahedron, L, W, and T indicated in the drawings are defined as a length direction, a width direction, and a thickness direction, respectively. The thickness direction may be the same as a layering direction in which dielectric layers are layered.

Figure 1B:
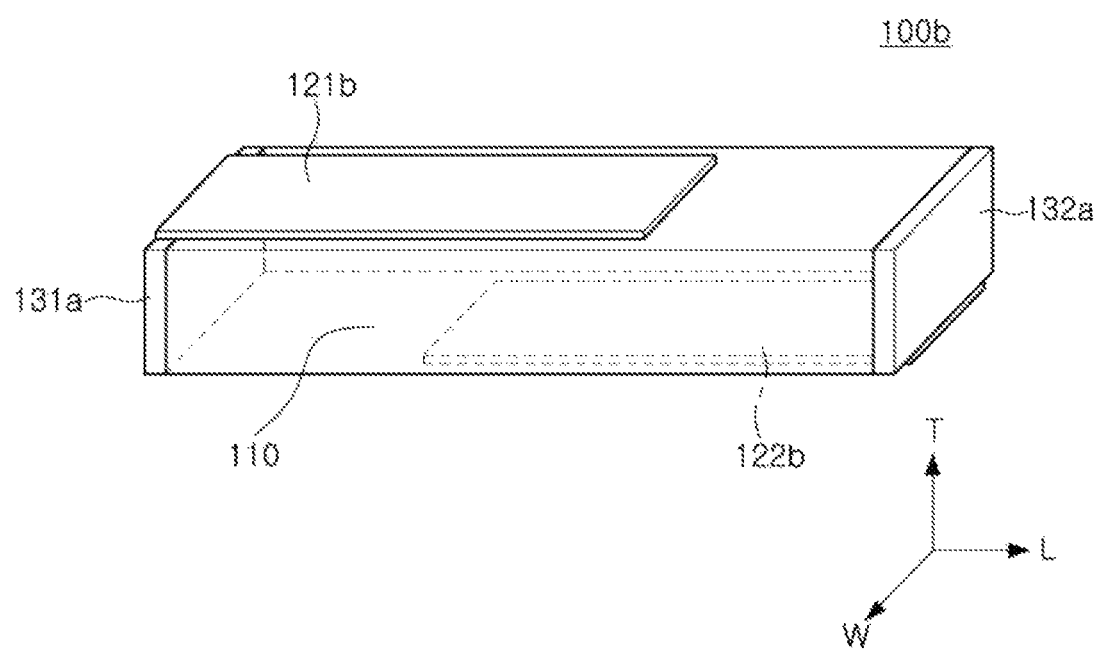

FIGS. 1A and 1B are perspective views illustrating a varistor according to an example embodiment.

Referring to FIG. 1A, a varistor 100a in the example embodiment may include a varistor body 110, a first electrode 121a, a second electrode 122a, a first terminal 131a, and a second terminal 132a, and the first electrode 121a and the second electrode 122a may be configured to not overlap in a thickness direction T.

Referring to FIG. 1B, a varistor 100b in the example embodiment may include a varistor body 110, a first electrode 121b, a second electrode 122b, a first terminal 131a, and a second terminal 132a, and the first electrode 121b and the second electrode 122b may be configured to overlap in the thickness direction T.

In the varistor body 110, a resistance value between a plurality of points may change depending on a voltage applied between the plurality of points. Thus, I-V (current-voltage) properties of the varistor body 110 may be nonlinear.

For example, the varistor body 110 may include ZnO and may be implemented as a $ZnO$—$Bi_2O_3$ based varistor body and a $ZnO$—$Pr_6O_{11}$ based varistor body, and may include additives such as Zn, Bi, Sb, Co, Mn, Si, Ni, and Zr. The additives may be related to the formation of a secondary crystalline phase and the formation of a liquid phase of the varistor body 110.

The first terminal 131a may be disposed on one side of the varistor body 110.

The second terminal 132a may be disposed on the other side of the varistor body 110.

The first electrode 121a and 121b may be disposed in an upper portion of the varistor body 110, may be electrically connected to the first terminal 131a, and may extend towards the other side of the varistor body 110.

The second electrode 122a and 122b may be disposed in a lower portion of the varistor body 110, may be electrically connected to the second terminal 132a, and may extend towards one side of the varistor body 110.

The first electrode 121a and the second electrode 122a may be electrically separated from each other. When a voltage applied between the first electrode 121a and the second electrode 122a is relatively low, the varistor body 110 may have a relatively high resistance value such that the first electrode 121a and the second electrode 122a may be insulated from each other. Similarly, the first electrode 121b and the second electrode 122b may be electrically separated from each other. When a voltage applied between the first electrode 121b and the second electrode 122b is relatively low, the varistor body 110 may have a relatively high resistance value such that the first electrode 121b and the second electrode 122b may be insulated from each other.

The higher the voltage applied between the first electrode 121a and the second electrode 122a, the lower the resistance value of the varistor body 110 may be, and when the voltage is higher than a breakdown voltage of the varistor 100a, the resistance value may rapidly decrease. Similarly, the higher the voltage applied between the first electrode 121b and the second electrode 122b, the lower the resistance value of the varistor body 110 may be, and when the voltage is higher than a breakdown voltage of the varistor 100b, the resistance value may rapidly decrease.

Thus, a voltage applied between the first electrode 121a and the second electrode 122a may form an electric field centered on a shortest route between the first electrode 121a and the second electrode 122a in the varistor 100a. By forming the electric field, electrons may be accumulated on one end of the first electrode 121a and on one end of the second electrode 122a, and the electrons may be stacked up in accordance with the shortest route. Similarly, a voltage applied between the first electrode 121b and the second electrode 122b may form an electric field centered on a shortest route between the first electrode 121b and the second electrode 122b in the varistor 100b. By forming the electric field, electrons may be accumulated on one end of the first electrode 121b and on one end of the second electrode 122b, and the electrons may be stacked up in accordance with the shortest route. The higher the magnitude of the electric field, the higher the height of the stacked electrons may be.

When the magnitude of the electric field is greater than a magnitude of a breakdown voltage, electrons on one end of the first electrode 121a and electrons on one end of the second electrode 122a may be in contact with each other. Accordingly, the varistor 100a may provide an electrical route centered on the shortest route. When the magnitude of the electric field is greater than a magnitude of a breakdown voltage, electrons on one end of the first electrode 121b and electrons on one end of the second electrode 122b may be in contact with each other. Accordingly, the varistor 100b may provide an electrical route centered on the shortest route.

Thus, the longer the shortest distance between the first electrode 121a and the second electrode 122a, the higher the breakdown voltage of the varistor 100a may be. The longer the shortest distance between the first electrode 121b and the second electrode 122b, the higher the breakdown voltage of the varistor 100b may be.

Thus, the varistor 100a and 100b in the example embodiment may have various levels of breakdown voltages by adjusting an extended length of the first electrode 121a and 121b and the second electrode 122a and 122b.

The varistor 100b in the example embodiment may have various levels of capacitance by adjusting a size of an area of overlap between the first electrode 121b and the second electrode 122b taken in a thickness direction.

With respect to a settling time of the varistor 100a and 100b for which a voltage is stabilized after a relatively high level of current flows, the higher the capacitance of the varistor 100a and 100b, the shorter the settling time may be, and the higher the capacitance, the higher the maximum current of the varistor 100a and 100b may be.

Thus, the varistor 100b in the example embodiment may have various ESD noise absorbing abilities and various levels of maximum currents by adjusting a size of an area of overlap between the first electrode 121a and 121b and/or the second electrode 122a and 122b.

The first and second terminals 131a and 132a may be configured to not extend to a side surface of the varistor body 110 taken in a width direction. Accordingly, in the varistor 100a and 100b in the example embodiment, sparks produced on the side surface of the varistor body 110 taken in the width direction may be reduced, and the varistor 100a and 100b may thus have stable properties (e.g., a breakdown voltage, an ESD noise absorbing ability, and the like).

Figure 2A:
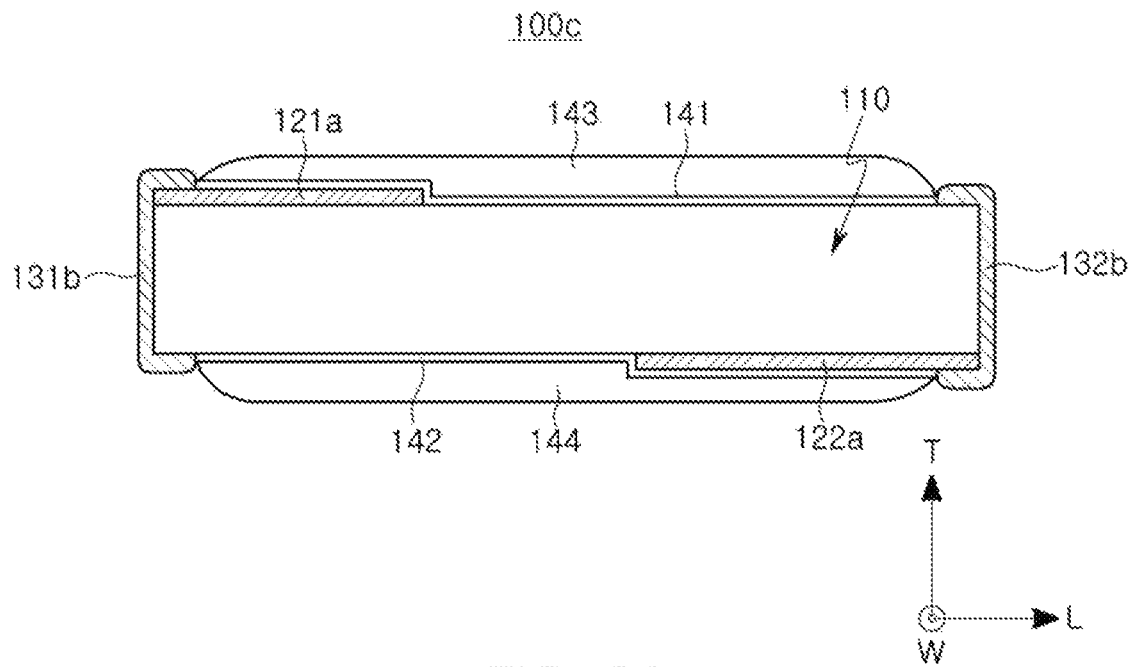
FIGS. 2A and 2B are side views illustrating a varistor according to an example embodiment of the present disclosure.
Figure 2B:
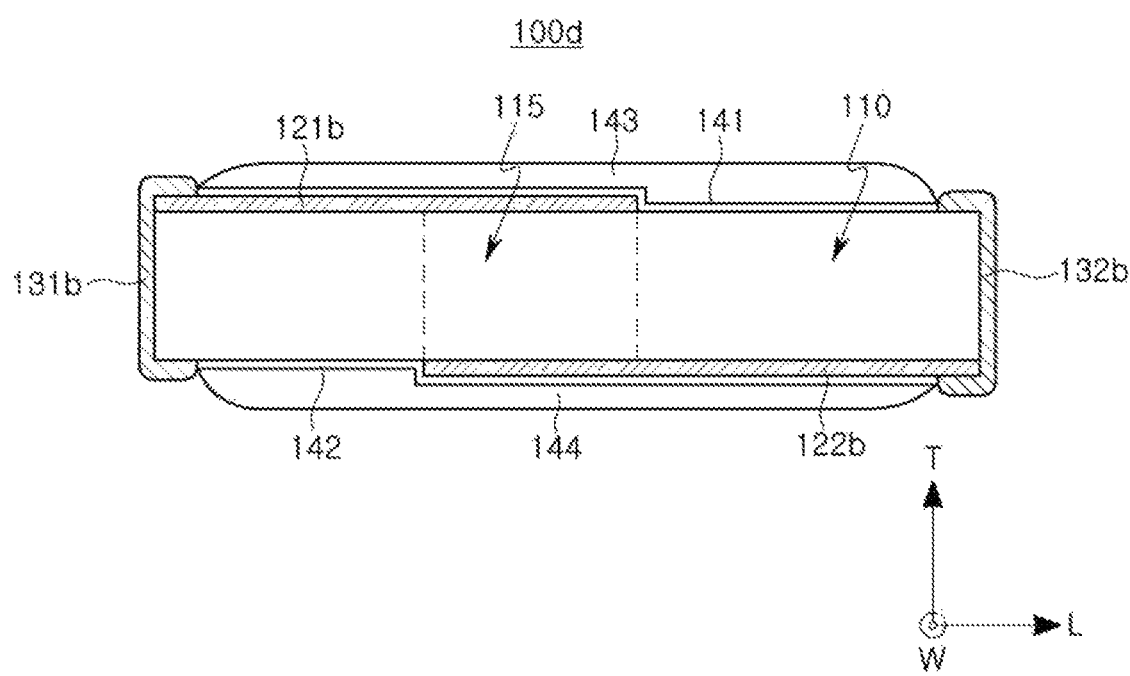

FIGS. 2A and 2B are side views illustrating a varistor according to an example embodiment.

Referring to FIG. 2A, a varistor 100c in the example embodiment may include at least portions of a varistor body 110, a first electrode 121a, a second electrode 122a, a first terminal 131b, a second terminal 132b, a first insulating layer 141, a second insulating layer 142, a third insulating layer 143, and a fourth insulating layer 144, and the first electrode 121a and the second electrode 122a may be configured to not overlap in the thickness direction T.

Referring to FIG. 2B, a varistor 100d in the example embodiment may include at least portions of a varistor body 110, a first electrode 121b, a second electrode 122b, a first terminal 131b, a second terminal 132b, a first insulating layer 141, a second insulating layer 142, a third insulating layer 143, and a fourth insulating layer 144, and may have an area of overlap 115 between the first electrode 121b and the second electrode 122b.

The first insulating layer 141 may be disposed on upper portions of the varistor body 110 and the first electrode 121a and 121b.

The second insulating layer 142 may be disposed on lower portions of the varistor body 110 and the second electrode 122a and 122b.

Accordingly, in the varistor 100c and 100d in the example embodiment, sparks produced on an upper surface and a lower surface of the varistor body 110 may be reduced, and the varistor 100c and 100d may thus have stable properties (e.g., a breakdown voltage, an ESD noise absorbing ability, and the like). Also, sparks between the electrode and the terminal may be prevented, a possibility of which may increase when the area of overlap 115 increases, and the varistor 100c and 100d may accordingly have improved durability.

For example, the first and second insulating layers 141 and 142 may be implemented as a high resistance material (e.g., $SiO_2$, $Al_2O_3$, and an organic material).

The first and second insulating layers 141 and 142 may be in contact with the first terminal 131b and the second terminal 132b, respectively. A portion of the first insulating layer 141 may be disposed between the first electrode 121a and the second terminal 132b, and a portion of the second insulating layer 142 may be disposed between the second electrode 122a and the first terminal 131b. A portion of the first insulating layer 141 may be disposed between the first electrode 121b and the second terminal 132b, and a portion of the second insulating layer 142 may be disposed between the second electrode 122b and the first terminal 131b.

Accordingly, in the varistor 100c and 100d in the example embodiments, sparks flowing on an upper surface and a lower surface of the varistor body 110 may be reduced, and the varistor 100c and 100d may thus have stable properties.

In example embodiments, the first insulating layer 141 may be configured to be bent at one end of the first electrode 121a and 121b, and the second insulating layer 142 may be configured to be bent at one end of the second electrode 122a and 122b, but an example embodiment thereof is not limited thereto.

Accordingly, in the example embodiment, a boundary of one end of the first electrode 121a and a boundary of one end of the second electrode 122a of the varistor 100c may be stably formed. Thus, a shortest distance between the first electrode 121a and the second electrode 122a may be stably adjusted, and the varistor 100c may thus have stable properties. A boundary of one end of the first electrode 121b and a boundary of one end of the second electrode 122b of the varistor 100d may be stably formed. Thus, a shortest distance between the first electrode 121b and the second electrode 122b may be stably adjusted, and the varistor 100d may thus have stable properties.

The third insulating layer 143 may be disposed on an upper portion of the first insulating layer 141.

The fourth insulating layer 144 may be disposed on a lower portion of the second insulating layer 142.

Accordingly, the third and fourth insulating layers 143 and 144 may be configured to protect against external impacts as compared to the first and second insulating layers 141 and 142, and the first and second insulating layers 141 and 142 may be configured to insulate the terminal and the electrode from each other as compared to the third and fourth insulating layers 143 and 144.

In example embodiments, the third and fourth insulating layers 143 and 144 may be harder than the first and second insulating layers 141 and 142 as a hardened epoxy resin, and may have a melting point lower than a melting point of the first and second insulating layers 141 and 142 as glass having a low melting point (e.g., $SiO_2$—$B_2O_3$—$Bi_2O_3$).

Accordingly, the varistor 100c and 100d in the example embodiment may secure an insulation performance by including the first and second insulating layers 141 and 142 and may also have an improved protection performance against external impacts, thereby having improved reliability.

One end of the first terminal 131b may be disposed on an upper portion of the first electrode 121a, and one end of the second terminal 132b may be disposed on a lower portion of the second electrode 122a. The first electrode 121a and the second electrode 122a may be disposed before the first terminal 131b and the second terminal 132b are disposed. One end of the first terminal 131b may be disposed on an upper portion of the first electrode 121b, and one end of the second terminal 132b may be disposed on a lower portion of the second electrode 122b. The first electrode 121b and the second electrode 122b may be disposed before the first terminal 131b and the second terminal 132b are disposed. Accordingly, the first terminal 131b and the second terminal 132b may be easily disposed in the varistor body 110, and an environment in which the extended lengths may be more accurately adjusted may be provided.

An internal space of the varistor body 110 may be filled with a non-conductive material or a semiconductor material and may not include an internal electrode disposed in the internal space. Thus, an internal space of the varistor body 110 may not include a conductive element such as an electrode or a terminal. Accordingly, an electric field formed in the varistor body 110 of the varistor 100c in accordance with a voltage between the first electrode 121a and the second electrode 122a may be more concentrated in a shortest route between the first electrode 121a and the second electrode 122a, and an electric field formed in the varistor body 110 of the varistor 100d in accordance with a voltage between the first electrode 121b and the second electrode 122b may be more concentrated in a shortest route between the first electrode 121b and the second electrode 122b. Thus, the varistor 100c and 100d in the example embodiment may have stable properties.

Figure 3A:
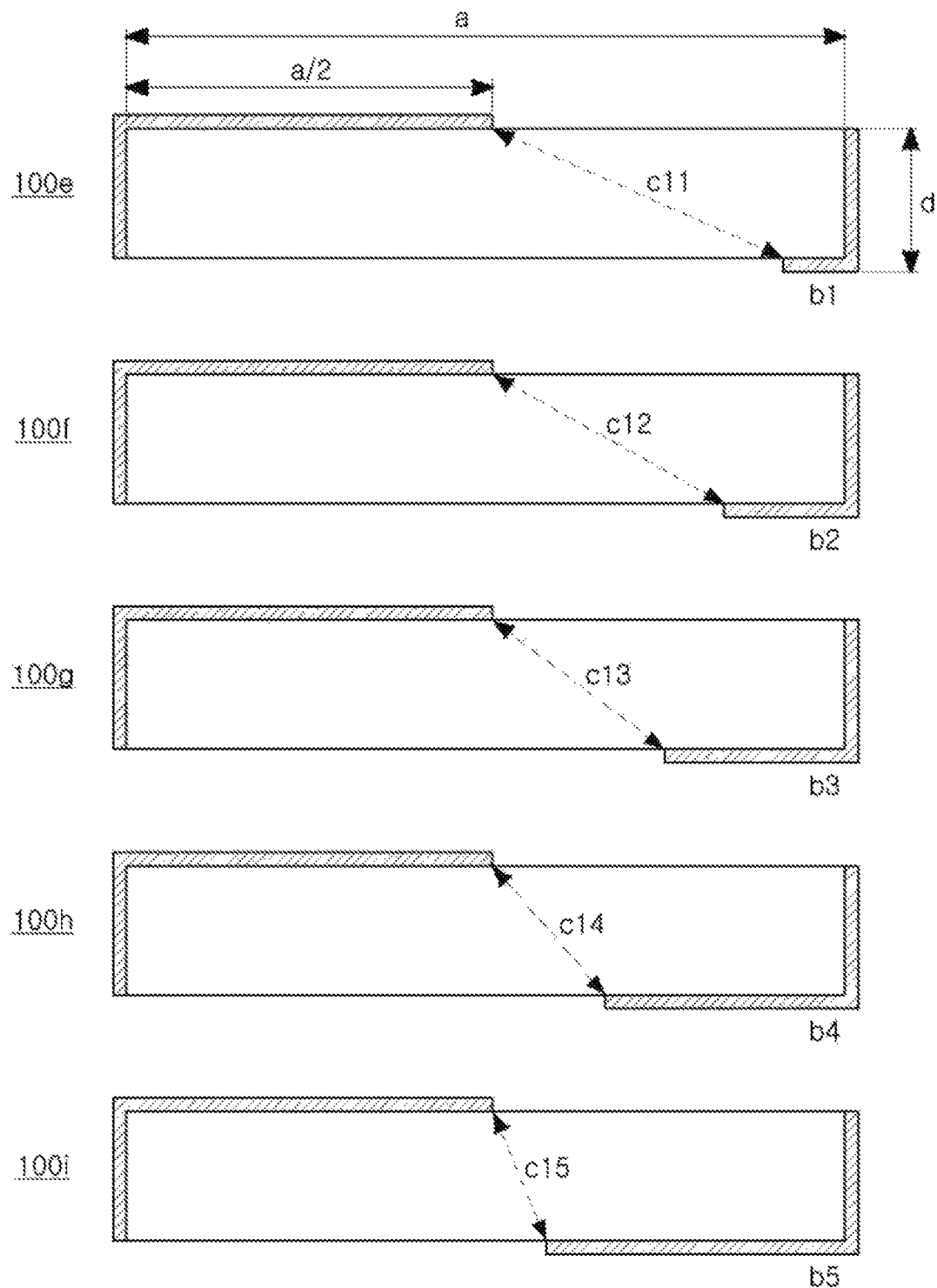
FIG. 3A is a side view illustrating changes in extended length of a single electrode of a varistor according to an example embodiment of the present disclosure.

FIG. 3A is a side view illustrating changes in extended length of a single electrode of a varistor according to an example embodiment.

Referring to FIG. 3A, a varistor 100e, 100f, 100g, 100h, and 100i in the example embodiment may include a varistor body having length a and thickness d, and may also include a first electrode having a fixed extended length a/2 and a second electrode having a changeable extended length b1, b2, b3, b4, and b5.

A shortest distance c (c11, c12, c13, c14, and c15 shown in the drawings) between the first and second electrodes of the varistor 100e, 100f, 100g, 100h, and 100i may be determined based on Equation 1 as below.

$$c=\sqrt{d^2+(a-a/2-b)^2}$$ [Equation 1]

Thus, the extended length a/2 of the first electrode and the extended length b (b1, b2, b3, b4, and b5 shown in the drawings) of the second electrode in the varistor 100e, 100e, 100f, 100g, 100h, and 100i may be different from each other. Accordingly, in the varistor 100e, 100f, 100g, 100h, and 100i in the example embodiment, the extended length of the first electrode may be optimized, and by adjusting only the extended length of the second electrode, an accurately adjusted breakdown voltage may be implemented.

Figure 3B:
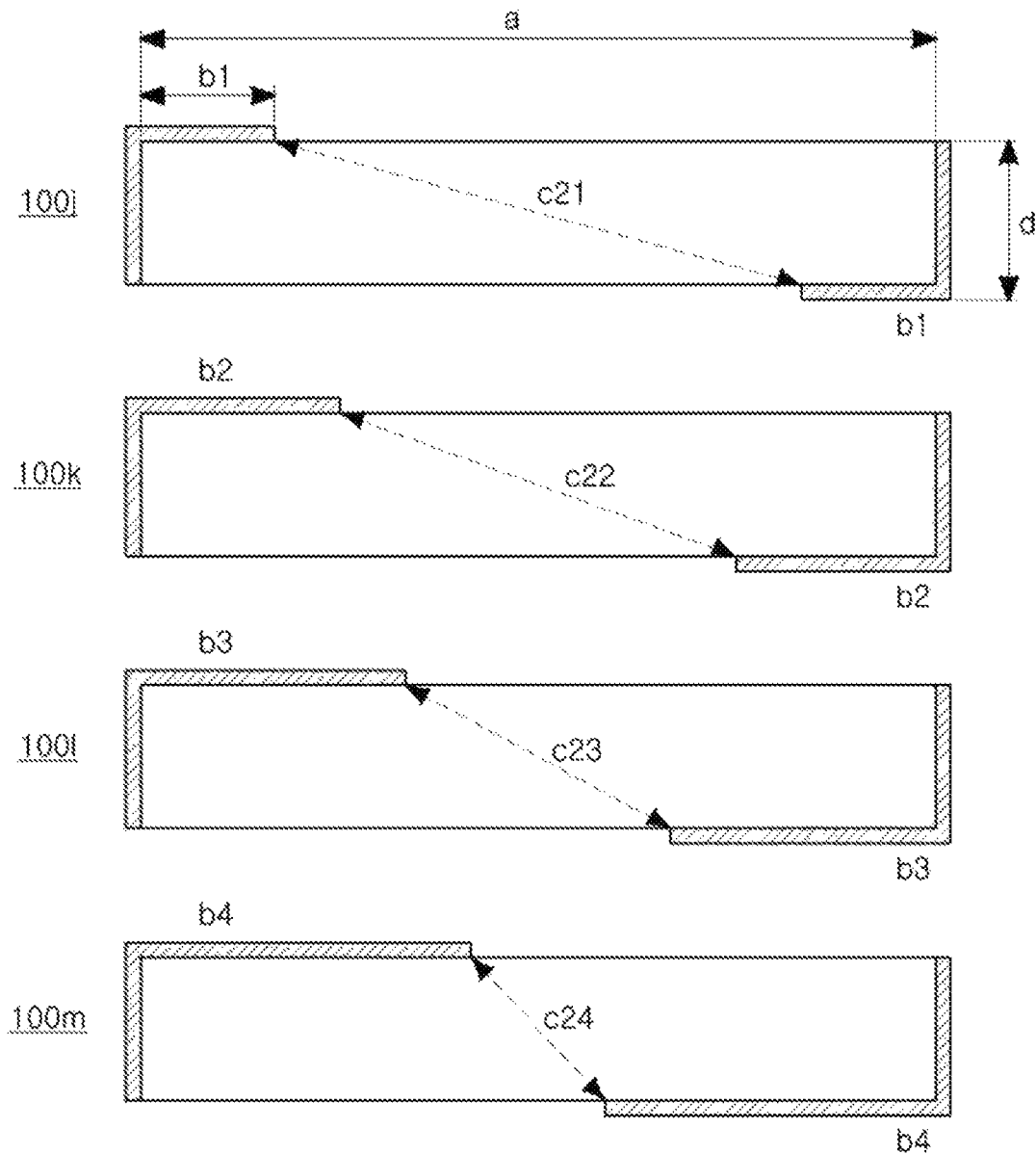
FIG. 3B is a side view illustrating changes in extended lengths of two electrodes of a varistor according to an example embodiment of the present disclosure.

FIG. 3B is a side view illustrating changes in extended lengths of two electrodes of a varistor according to an example embodiment.

Referring to FIG. 3B, a varistor 100j, 100k, 100l, and 100m in the example embodiment may include a varistor body having length a and thickness d, and may include first and second electrodes each having a changeable extended length b1, b2, b3, and b4.

A shortest distance c21, c22, c23, and c24 between the first and second electrodes of the varistor 100j, 100k, 100l, and 100m may be determined based on Equation 2 as below.

$$c=\sqrt{d^2+(a-b\times 2)^2}$$ [Equation 2]

Each of the extended lengths b (b1, b2, b3, and b4 shown in the drawings) of the first and second electrodes may be greater than the thickness d of the varistor body. Accordingly, a size of the varistor 100j, 100k, 100l, and 100m may be reduced, and the varistor 100j, 100k, 100l, and 100m may have a relatively wide range of breakdown voltage adjustment in accordance with the adjustment of the lengths of the first and second electrodes.

Figure 3C:
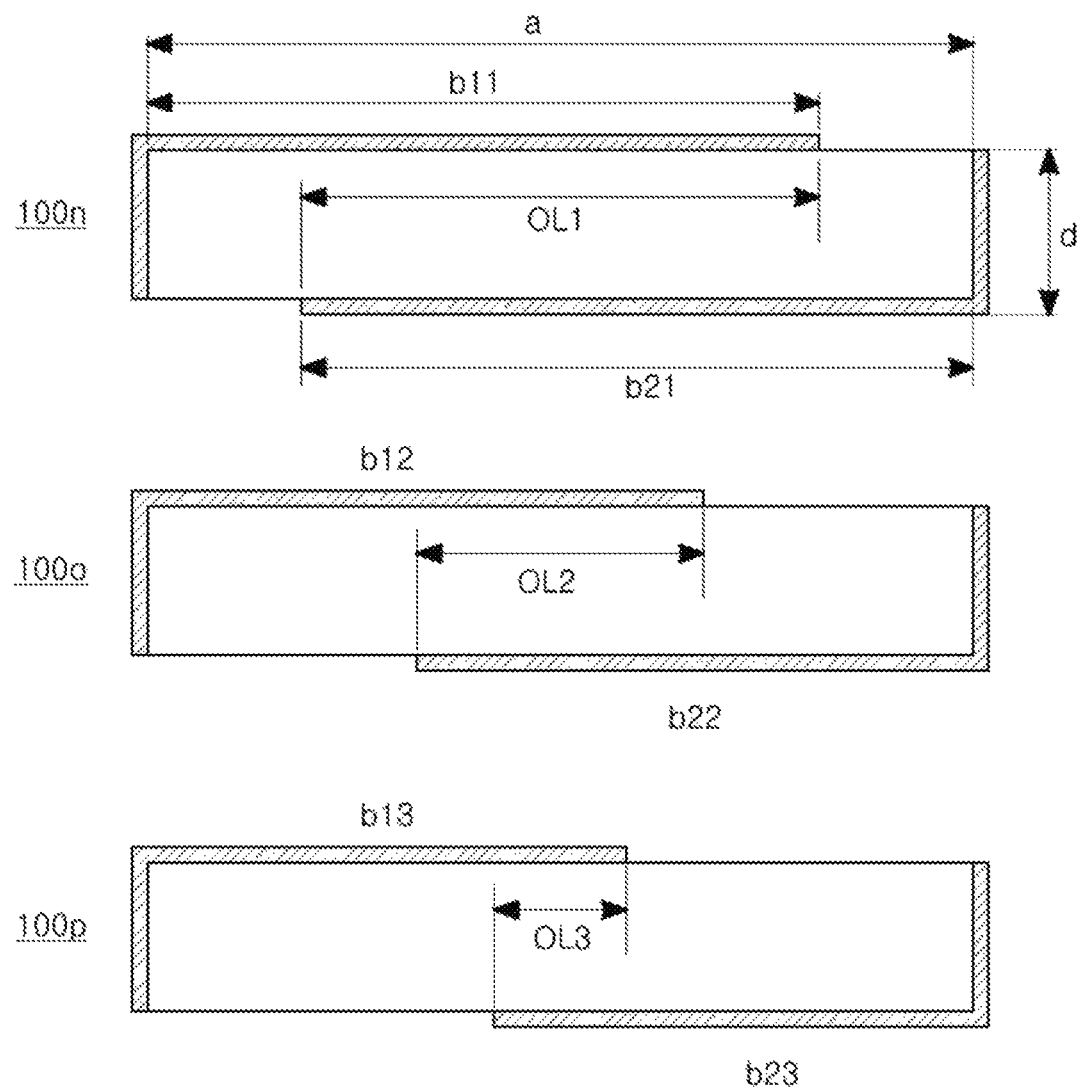
FIG. 3C is a side view illustrating changes in extended lengths of overlapping first and second electrodes of a varistor according to an example embodiment of the present disclosure.

FIG. 3C is a side view illustrating changes in extended lengths of overlapping first and second electrodes of a varistor according to an example embodiment.

Referring to FIG. 3C, a varistor 100n, 100o, and 100p in the example embodiment may include a varistor body having length a and thickness d, and may include a first electrode having a changeable extended length b11, b12, and b13, and a second electrode having a changeable extended length b21, b22, and b23.

The length of an area of overlap between the first and second electrodes of the varistor 100n, 100o, and 100p may be determined based on Equation 3 as below.

$$OL=a-[(a-b1)+(a-b2)]$$ [Equation 3]

In Equation 3, "b1" and "b2" indicate extended lengths of the first and second electrodes, respectively.

Figure 4A:
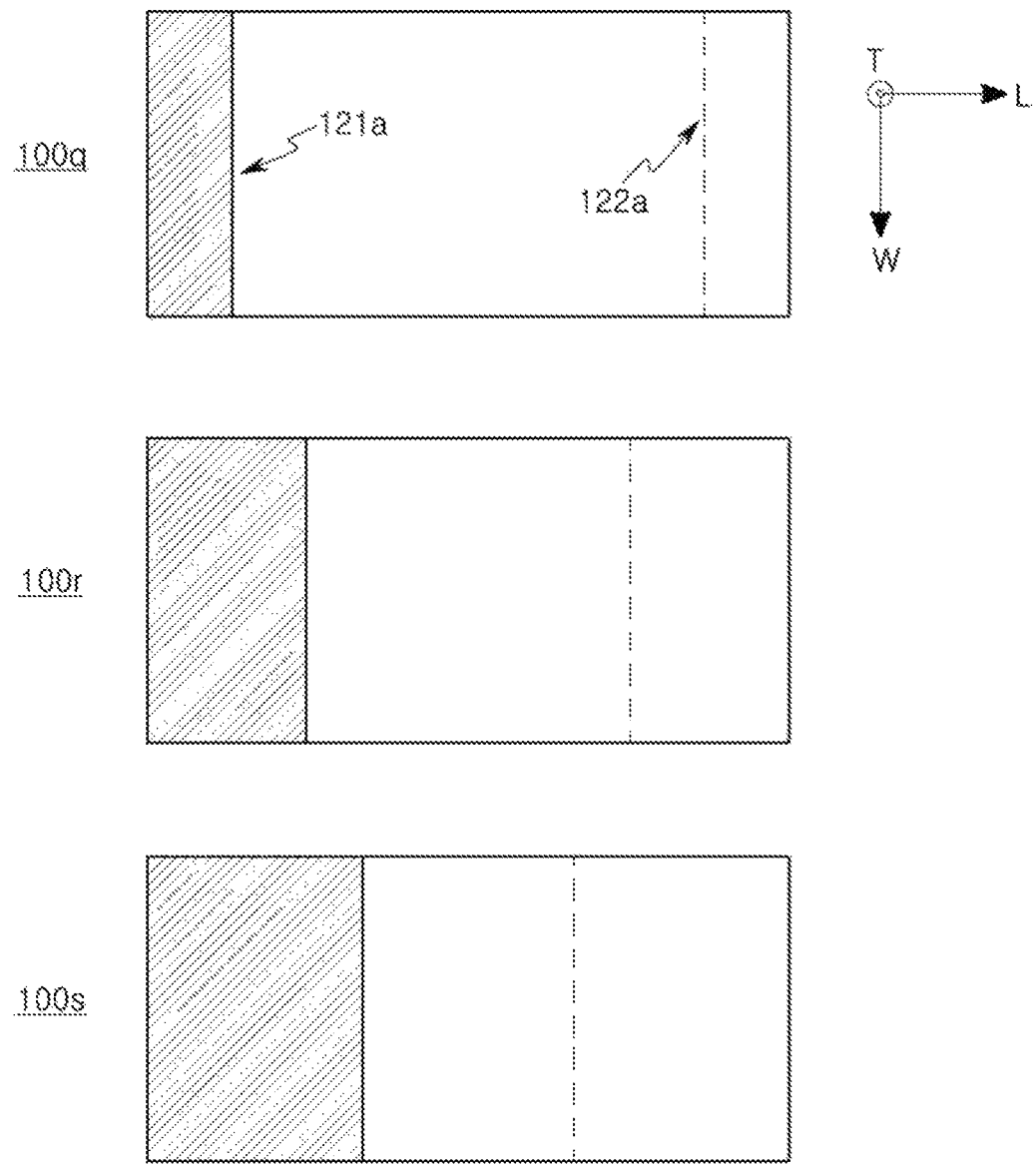
FIG. 4A is a plan view illustrating changes in extended length of a varistor according to an example embodiment of the present disclosure.

FIG. 4A is a plan view illustrating changes in extended length of a varistor according to an example embodiment.

Referring to FIG. 4A, a varistor 100q, 100r, and 100s in the example embodiment may have first and second electrodes 121a and 122a each having a width the same as a width of a varistor body.

Figure 4B:
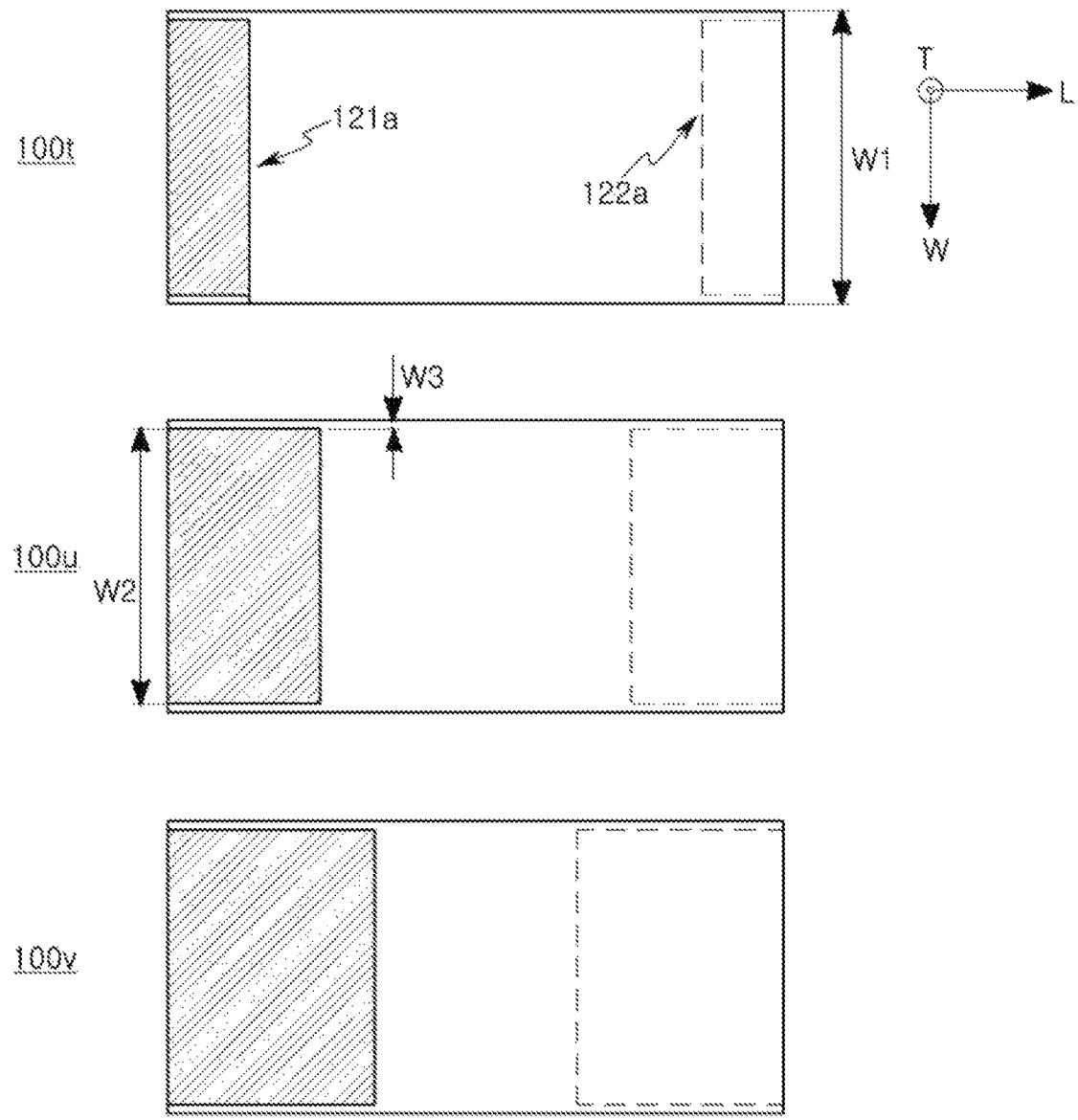
FIG. 4B is a plan view illustrating a width of a varistor according to an example embodiment of the present disclosure.

FIG. 4B is a plan view illustrating a width of a varistor according to an example embodiment.

Referring to FIG. 4B, a width W2 of each of the first and second electrodes 121a and 122a of a varistor 100t, 100u, and 100v in the example embodiment may be less than a width W1 of the varistor body.

Thus, a margin region may be formed on one sides and the other sides of the first and second electrodes 121a and 122a. A width W3 of the margin region may be obtained by subtracting the width W2 of the first and second electrodes 121a and 122a from the width W1 of the varistor body.

Accordingly, the first and second electrodes 121a and 122a may be prevented from leaking from a side surface of the varistor body while manufacturing the first and second electrodes 121a and 122a, and thus, in the example embodiment, sparks produced on a side surface of the varistor 100t, 100u, and 100v may be reduced, and the varistor 100t, 100u, and 100v may have stable properties and improved durability.

The first insulating layer described with reference to FIGS. 2A and 2B may cover an upper surface and a side surface of the first electrode 121a to prevent the first electrode 121a from being exposed, and the second insulating layer may cover a lower surface and a side surface of the second electrode 122a to prevent the second electrode 122a from being exposed. The third and fourth insulating layers may also cover upper and lower surfaces and side surfaces of the first and second electrodes 121a and 122a, respectively.

Accordingly, in the example embodiment, sparks produced on side surfaces of the varistor 100t, 100u, and 100v may be effectively reduced, and the varistor 100t, 100u, and 100v may have stable properties and improved durability.

Figure 5A:
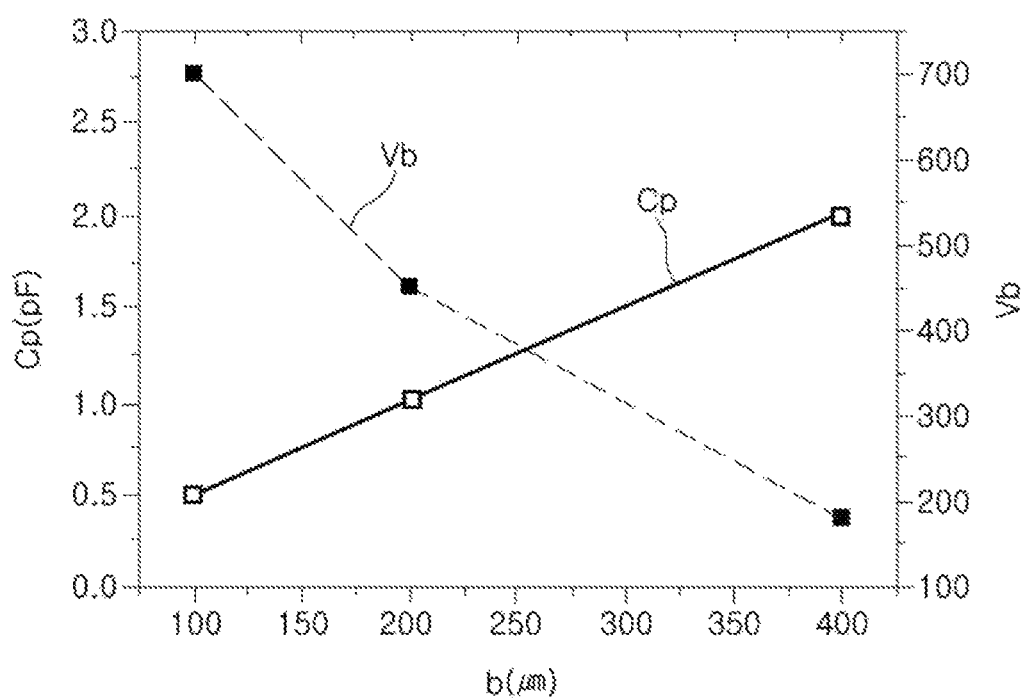
FIG. 5A is graphs illustrating capacitance and breakdown voltage in accordance with an extended length of an electrode of a varistor according to an example embodiment of the present disclosure.

FIG. 5A is graphs illustrating capacitance and a breakdown voltage in accordance with an extended length of an electrode of a varistor according to an example embodiment.

Referring to FIG. 5A, the longer the extended length b of first and second electrodes, the lower the breakdown voltage Vb of a varistor, and the longer the extended length b of the first and second electrodes, the higher the capacitance Cp of the varistor.

Figure 5B:
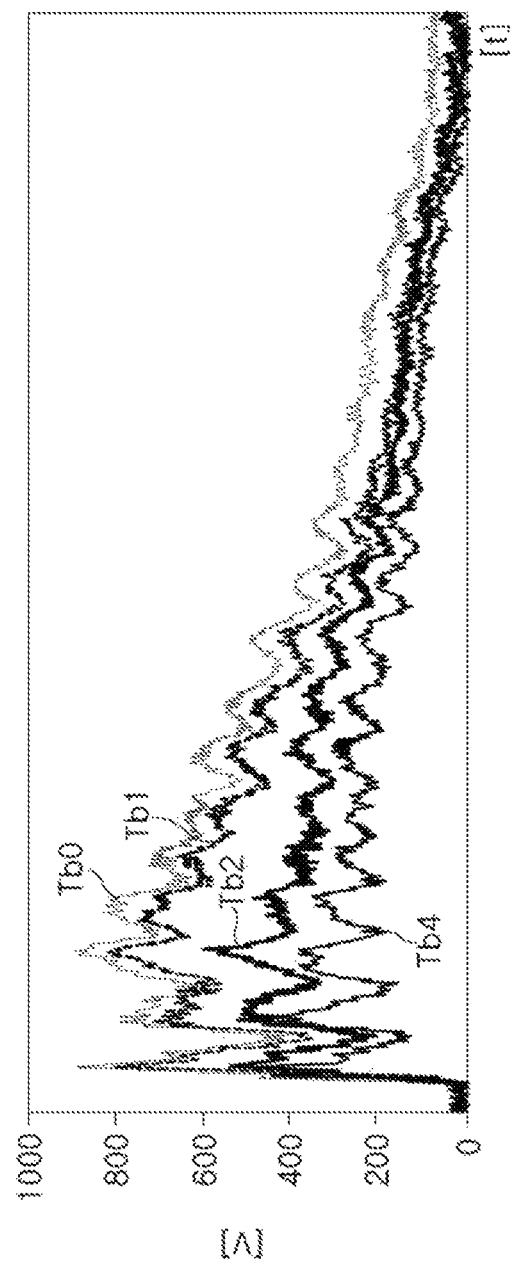
FIG. 5B is graphs illustrating voltage transient in accordance with an extended length of an electrode of a varistor according to an example embodiment of the present disclosure.

FIG. 5B is graphs illustrating voltage transient in accordance with an extended length of an electrode of a varistor according to an example embodiment.

Referring to FIG. 5B, the longest period of time may be consumed to stabilize a first voltage transient Tb0 of the varistor in which extended lengths of the first and second electrodes are 0, and the first voltage transient Tb0 may have the highest peak voltage.

The second longest period of time may be consumed to stabilize a second voltage transient Tb1 of a varistor in which extended lengths of first and second electrodes are 100 μm, and the second voltage transient Tb1 may have the second highest peak voltage.

The third longest period of time may be consumed to stabilize a third voltage transient Tb2 of a varistor in which extended lengths of first and second electrodes are 200 μm, and the third voltage transient Tb2 may have the third highest peak voltage.

The shortest period of time may be consumed to stabilize a fourth voltage transient Tb4 of a varistor in which extended lengths of first and second electrodes are 400 μm, and the fourth voltage transient Tb4 may have the lowest peak voltage.

Also, the varistor in which extended lengths of the first and second electrodes are 100 μm may have an ESD noise absorbing ability corresponding to a value obtained by subtracting an integral value of the second voltage transient Tb1 from an integral value of the first voltage transient Tb0.

The varistor in which extended lengths of the first and second electrodes are 200 μm may have an ESD noise absorbing ability corresponding to a value obtained by subtracting an integral value of the third voltage transient Tb2 from an integral value of the first voltage transient Tb0.

The varistor in which extended lengths of the first and second electrodes are 400 μm may have an ESD noise absorbing ability corresponding to a value obtained by subtracting an integral value of the fourth voltage transient Tb4 from an integral value of the first voltage transient Tb0.

Figure 5C:
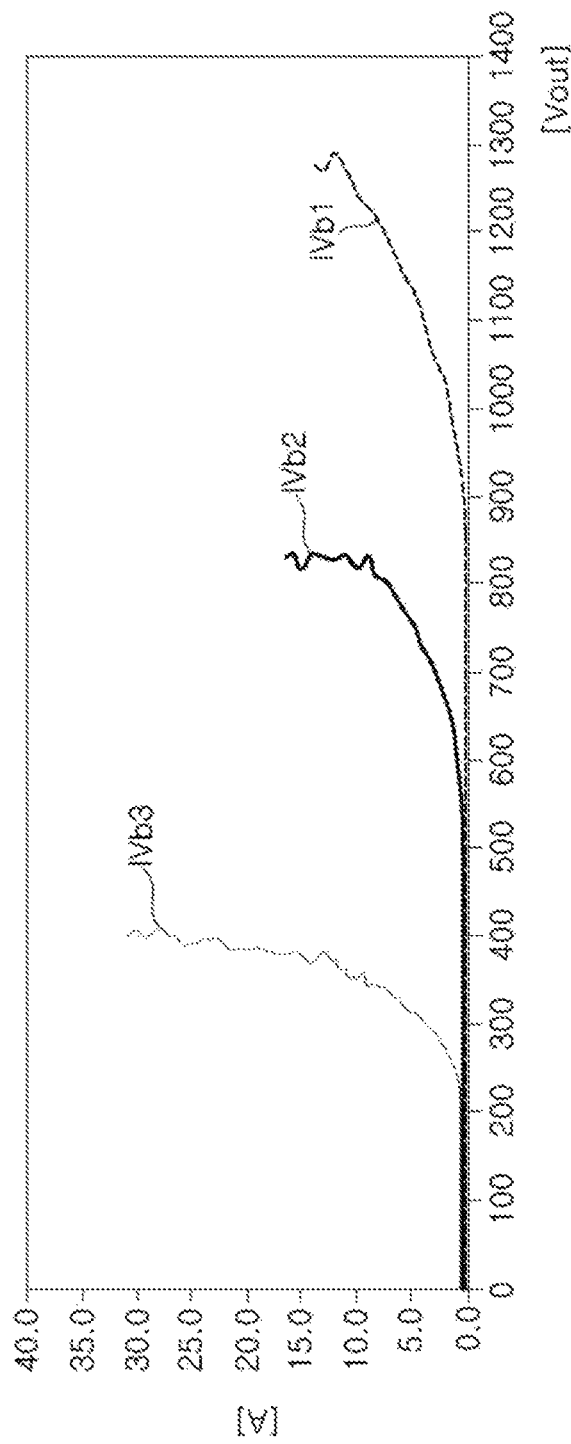
FIG. 5C is graphs illustrating I-V properties in accordance with extended lengths of non-overlapping electrodes of a varistor according to an example embodiment of the present disclosure.

FIG. 5C shows graphs illustrating I-V properties in accordance with an extended length of a non-overlapping electrode of a varistor according to an example embodiment.

Referring to FIG. 5C, a second I-V property IVb2 of a varistor in which extended lengths of first and second electrodes are 200 μm may have an intermediate property of a first I-V property IVb1 of a varistor in which extended lengths of first and second electrodes are 100 μm and a third I-V property IVb3 of a varistor in which extended lengths of first and second electrodes are 400 μm.

For example, a breakdown voltage of the second I-V property IVb2 may be lower than a breakdown voltage of the first I-V property IVb1 and may be higher than a breakdown voltage of the third I-V property IVb3.

Figure 5D:
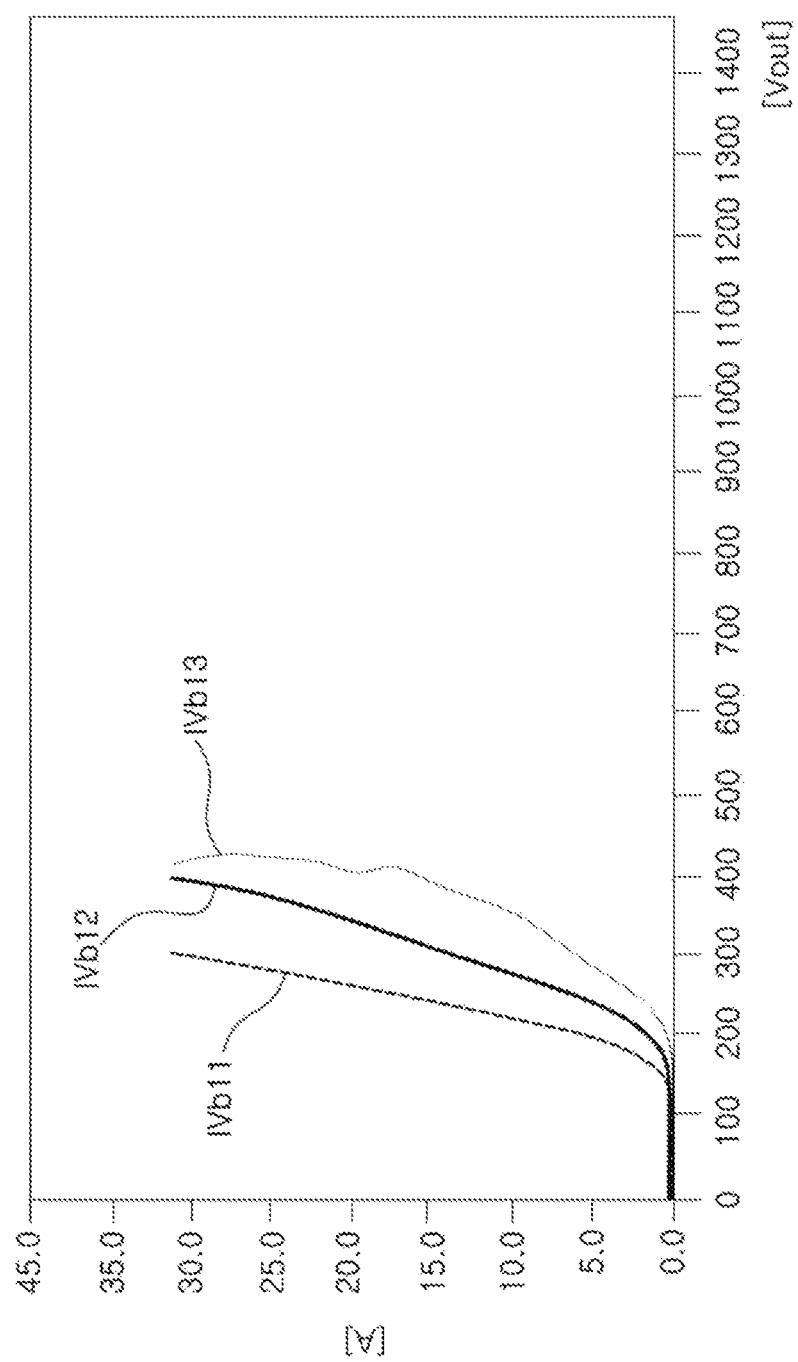
FIG. 5D is graphs illustrating I-V properties in accordance with extended lengths of overlapping electrodes of a varistor according to an example embodiment of the present disclosure.

FIG. 5D shows graphs illustrating I-V properties in accordance with extended lengths of overlapping electrodes of a varistor according to an example embodiment.

Referring to FIG. 5D, a second I-V property IVb12 of a varistor in which a size of an area of overlap between first and second electrodes is intermediate may have an intermediate property of a first I-V property IVb11 of a varistor in which a size of an area of overlap between first and second electrodes is relatively small and a third I-V property IVb13 of a varistor in which a size of an area of overlap between first and second electrodes is relatively large.

For example, the first I-V property IVb11, the second I-V property IVb12, and the third I-V property IVb13 may have a relatively steep I-V slop as compared to an example in which the first and second electrodes do not overlap, and the first I-V property IVb11, the second I-V property IVb12, and the third I-V property IVb13 may have different I-V slopes.

Figure 6A:
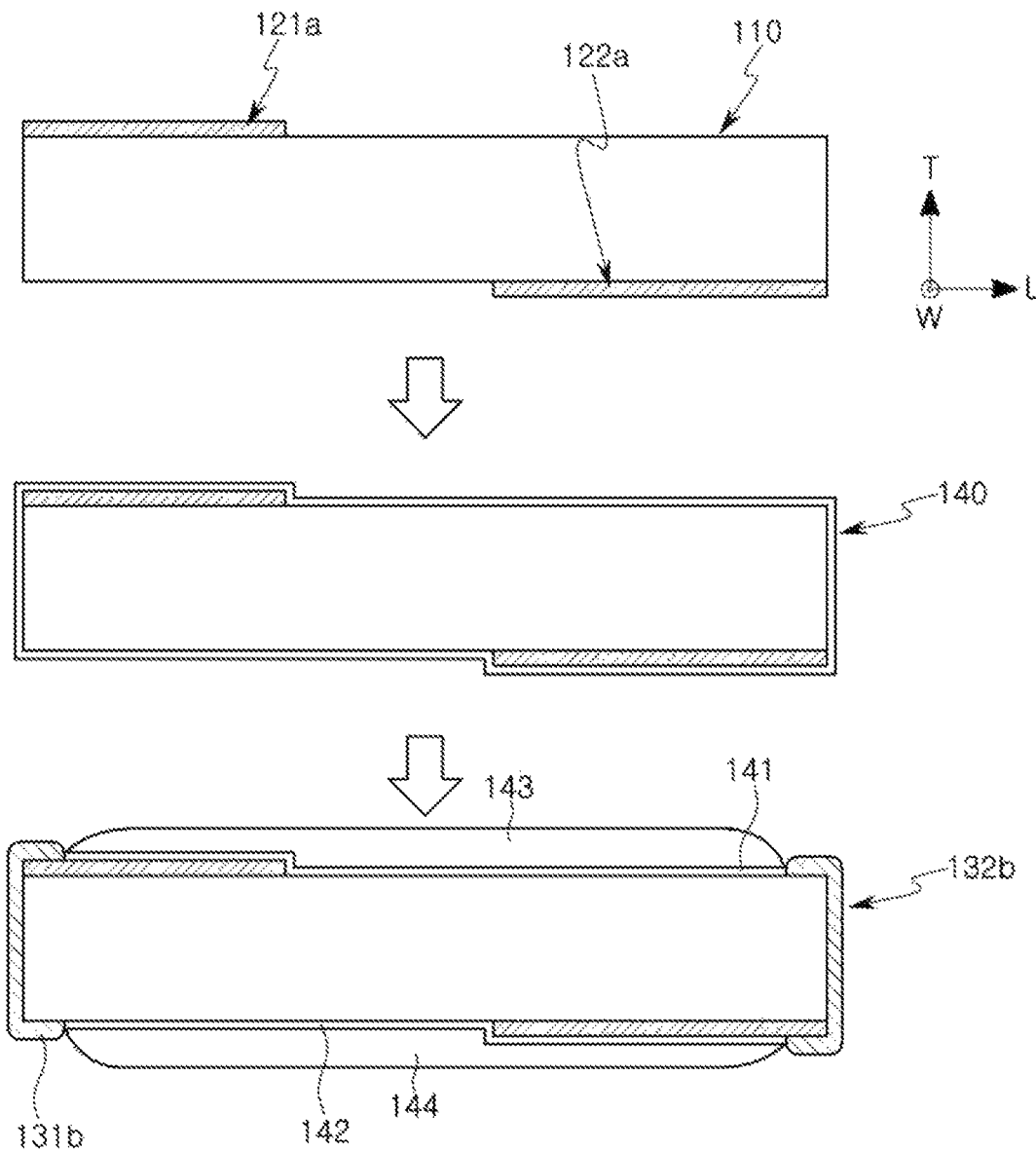
FIG. 6A is a diagram illustrating processes of manufacturing a varistor according to an example embodiment of the present disclosure.

FIG. 6A is a diagram illustrating processes of manufacturing a varistor according to an example embodiment.

Referring to FIG. 6A, first and second electrodes 121a and 122a may be disposed in an upper portion and a lower portion of a varistor body 110, respectively.

An overall area of the varistor body 110 may be coated with an insulating film 140.

The insulating film 140 may be divided into first and second insulating layers 141 and 142, and first and second terminals 131b and 132b may be disposed on one side and the other side of the varistor body 110 taken in a length direction L, respectively. Third and fourth insulating layers 143 and 144 may be disposed on upper surfaces and lower surfaces of the first and second insulating layers 141 and 142, respectively.

Figure 6B:
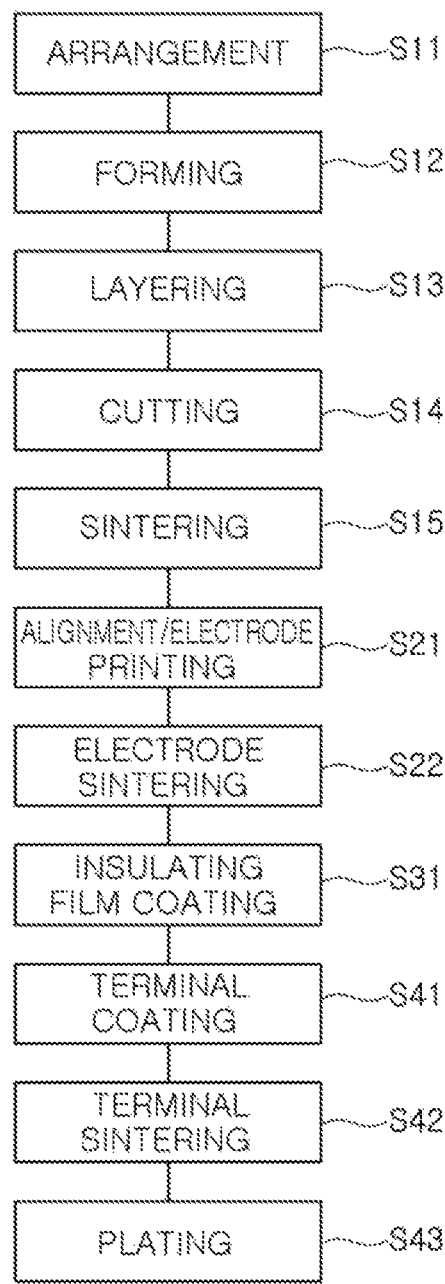
FIG. 6B is a flowchart illustrating processes of manufacturing a varistor according to an example embodiment of the present disclosure.

FIG. 6B is a flowchart illustrating processes of manufacturing a varistor according to an example embodiment.

Referring to FIG. 6B, a varistor body may be manufactured through an arrangement process S11, a forming process S12, a layering process S13, a cutting process S14, and a sintering process S15.

In the arrangement process S11, ZnO and additives (Zn, Bi, Sb, Co, Mn, Si, Ni, Zr, and the like) may be wet-mixed, the mixture may be ground and distributed, and a dried powder formed therefrom may be calcinated under conditions of maintaining the dried powder at 700° C. for 3 hours and may be wet-ground and distributed, thereby preparing a calcinated additive powder. Thereafter, a batch process may be performed to make slurry. An average grain size of the powder may not be limited to any particular size.

In the forming process S12, impurities may be removed by filtering the slurry, an aging process may be performed on the slurry to remove bubbles in the slurry, and a forming process may be performed on the slurry in a green sheet forming device such that the slurry may have a certain thickness.

In the layering process S13, the formed sheet may be cut out in a certain size, and a plurality of green sheets, each of which are formed to have a target thickness in consideration of a thickness reduction rate, may be stacked and may be uniaxially pressured at a temperature of approximately 65° C., thereby manufacturing a green bar in which sheets are lightly adhered to each other.

In the cutting process S14, the manufactured green bar may be compressed through an ISO pressing process such that a green bar in which the layered green sheets are integrated, the green bar may be sintered, and the sintered green bar may be cut out in X and Y directions as chips, each having a 1005 size, thereby preparing green chips.

In the sintering process S15, the green chip may go through a plasticization process at 400° C. for 5 hours, a binder burn-out process may be performed on the green chip to remove an organic component, and the like, used in the arrangement process S11, and a sintering process may be performed on the green chip at a temperature between 950 to 1050° C. for 1 hour, thereby manufacturing a varistor body.

After the sheets are sintered, the sheets may be integrated such that a boundary between adjacent sheets may not be identified without using a scanning electron microscope (SEM).

Referring to FIG. 6B, first and second electrodes may be manufactured through an alignment/electrode printing process S21 and an electrode sintering process S22.

In the alignment/electrode printing process S21, the varistor body may be wet-ground, washed, dried, and aligned, and electrodes may be printed on an upper portion and a lower portion of the varistor body by a screen printing method using a conductive paste such as palladium (Pd), silver (Ag), or platinum (Pt), or alloys thereof.

In the electrode sintering process S22, the electrodes may be dried at 150° C. and may be sintered in a belt furnace of 600° C.

Referring to FIG. 6B, first and second insulating layers may be manufactured through an insulating film coating process S31.

In the insulating film coating process S31, the varistor body in which the electrodes are sintered may be submerged in an $SiO_2$ Sol solution, dried, and hardened at 250° C., thereby forming a thin insulating film on a surface of the chip.

In example embodiments, in the film coating process S31, an Al$_2$O$_3$ insulating film may be formed in thickness of 200 nm or less by a plasma coating process using a pulsed laser deposition (PLD) facility.

In example embodiments, in the film coating process S31, a glass paste may be coated after forming the SiO$_2$ insulating film and the Al$_2$O$_3$ insulating film, and a heat treatment process may be performed, thereby forming a glass coating layer. The insulating layers may also be formed only using glass without coating SiO$_2$ and Al$_2$O$_3$. Also, instead of the glass coating layer, a hardened epoxy resin may be disposed as the third and fourth insulating layers.

Referring to FIG. 6B, first and second terminals may be manufactured through a terminal coating process S41, a terminal sintering process S42, and a plating process S43.

In the terminal coating process S41, terminals may be coated on one side and the other side of the varistor body taken in a length direction using a conductive paste such as palladium (Pd), silver (Ag), or platinum (Pt), or alloys thereof. A coating thickness may be configured to be within 100 μm, but an example of the thickness is not limited thereto. In example embodiments, the terminals may also be formed by a sheet transferring method or a pad transferring method.

In the terminal sintering process S42, the terminals may be coated and dried, and may be sintered in a belt furnace of 600° C.

In the plating process S43, the terminals may be plated with Ni, Cu, and Sn.

According to the aforementioned example embodiments, at least one of various properties (e.g., breakdown voltage, capacitance, an I-V curve slope, an ability to absorb ESD noise, a maximum current, and the like) of the varistor may be easily adjusted.

Also, by preventing sparks produced on an upper surface, a lower surface and/or side surfaces of the varistor body, the varistor may have stable properties.

While the example embodiments have been shown and described above, it will be apparent to those skilled in the art that modifications and variations could be made without departing from the scope of the present invention as defined by the appended claims.

What is claimed is:

1. A varistor, comprising:
   a varistor body;
   a first terminal disposed on one side of the varistor body;
   a second terminal disposed on another side of the varistor body;
   a first electrode disposed on an upper portion of the varistor body, connected to the first terminal, and extending towards the another side of the varistor body; and
   a second electrode disposed on a lower portion of the varistor body, connected to the second terminal, and extending towards the one side of the varistor body,
   wherein the first terminal extends from the one side of the varistor body onto a portion of the first electrode on the upper portion of the varistor body,
   the second terminal extends from the another side of the varistor body onto a portion of the second electrode on the lower portion of the varistor body, and
   the varistor further comprises:
      a first insulating layer disposed on another portion of the first electrode and extending to cover a portion of the upper portion of the varistor body exposed from the first electrode;
      a second insulating layer disposed on another portion of the second electrode and extending to cover a portion of the lower portion of the varistor body exposed from the second electrode;
      a third insulating layer disposed on the first insulating layer, and covering the another portion of the first electrode and the portion of the upper portion of the varistor body exposed from the first electrode; and
      a fourth insulating layer disposed on the second insulating layer, and covering the another portion of the second electrode and the portion of the lower portion of the varistor body exposed from the second electrode.

2. The varistor of claim 1,
   wherein the varistor body comprises ZnO, and
   wherein an internal space of the varistor body is filled with a non-conductive material or a semiconductor material and does not include an internal electrode disposed in the internal space.

3. The varistor of claim 1, wherein each of the first and second insulating layers is spaced apart from the one side and the another side of the varistor body.

4. The varistor of claim 3,
   wherein the third insulating layer has a melting point lower than a melting point of the first insulating layer, and
   the fourth insulating layer has a melting point lower than a melting point of the second insulating layer.

5. The varistor of claim 4, wherein each of the third and fourth insulating layers comprises SiO$_2$—B$_2$O$_3$—Bi$_2$O$_3$.

6. The varistor of claim 1,
   wherein the third insulating layer is harder than the first insulating layer, and
   the fourth insulating layer is harder than the second insulating layer.

7. The varistor of claim 6, wherein each of the third and fourth insulating layers comprises a hardened epoxy resin.

8. The varistor of claim 1,
   wherein the first and second insulating layers are in contact with the first terminal and the second terminal, respectively,
   wherein a portion of the first insulating layer is disposed between the first electrode and the second terminal, and
   wherein a portion of the second insulating layer is disposed between the second electrode and the first terminal.

9. The varistor of claim 1,
   wherein the first insulating layer is bent at one end of the first electrode, and
   wherein the second insulating layer is bent at one end of the second electrode.

10. The varistor of claim 1,
    wherein a width of the first electrode is less than a width of the varistor body, and
    wherein a width of the second electrode is less than the width of the varistor body.

11. The varistor of claim 10,
    wherein the first insulating layer covers a side surface of the first electrode to prevent the first electrode from being exposed, and
    the second insulating layer covers a side surface of the second electrode to prevent the second electrode from being exposed.

12. The varistor of claim 1, wherein the first and second terminals are spaced apart from side surfaces of the varistor body in a width direction.

13. The varistor of claim 1, wherein a length of the first electrode and a length of the second electrode are each greater than a thickness of the varistor body.

14. The varistor of claim 13, wherein the first electrode and the second electrode overlap in a thickness direction of the varistor body.

15. The varistor of claim 1, wherein a length of the first electrode is different from a length of the second electrode.

16. The varistor of claim 1, wherein the first electrode and the second electrode do not overlap in a thickness direction of the varistor body.

17. The varistor of claim 1, wherein each of the first and second insulating layers comprises one of $SiO_2$, $Al_2O_3$, and an organic material.

* * * * *